(12) United States Patent
Sekiguchi (10) Patent No.: US 8,786,289 B2
(45) Date of Patent: Jul. 22, 2014

(54) METHOD AND SEMICONDUCTOR DEVICE FOR MONITORING BATTERY VOLTAGES

(75) Inventor: Masaru Sekiguchi, Saitama (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 478 days.

(21) Appl. No.: 13/093,017

(22) Filed: Apr. 25, 2011

(65) Prior Publication Data

US 2011/0260770 A1    Oct. 27, 2011

(30) Foreign Application Priority Data

Apr. 27, 2010    (JP) ................... 2010-102385

(51) Int. Cl.
 G01N 27/416    (2006.01)
 H02J 7/00    (2006.01)
(52) U.S. Cl.
 USPC .......................................... 324/433; 320/116
(58) Field of Classification Search
 USPC ........................ 320/116–123; 324/433, 434
 See application file for complete search history.

(56) References Cited

U.S. PATENT DOCUMENTS

| | | | | |
|---|---|---|---|---|
| 7,564,216 | B2 * | 7/2009 | Carrier et al. ................ | 320/116 |
| 7,663,375 | B2 * | 2/2010 | Yonezawa .................... | 324/434 |
| 2002/0070733 | A1 | 6/2002 | Takada et al. | |

FOREIGN PATENT DOCUMENTS

| | | |
|---|---|---|
| JP | 06-149420 | 5/1994 |
| JP | 11-295353 | 10/1999 |
| JP | 2000-284003 | 10/2000 |
| JP | 2000-356656 | 12/2000 |
| JP | 2002-139523 | 5/2002 |
| JP | 2003-070179 | 3/2003 |
| JP | 2003-282158 | 10/2003 |
| JP | 2005-010076 | 1/2005 |
| JP | 2005-188936 | 7/2005 |

OTHER PUBLICATIONS

Notice of Reason for Rejection dated Nov. 12, 2013.

* cited by examiner

Primary Examiner — Richard V Muralidar
(74) Attorney, Agent, or Firm — Volentine & Whitt, PLLC (57) ABSTRACT

A semiconductor device for monitoring batteries or cells connected in series has a selector switch that selects one of the batteries or cells and outputs voltages obtained from its positive and negative terminals. A pair of buffer amplifiers receives these voltages at high-impedance input terminals and output corresponding voltages to a level shifter. The level shifter generates an output voltage equal to the difference between the outputs of the buffer amplifiers. By preventing current flow between the selector switch and the level shifter, the buffer amplifiers reduce the output droop that occurs at the beginning of a voltage measurement, even if the semiconductor device is connected to the batteries or cells through a low-pass filter circuit with a comparatively large time constant. Measurement time is shortened accordingly.

20 Claims, 11 Drawing Sheets

METHOD AND SEMICONDUCTOR DEVICE FOR MONITORING BATTERY VOLTAGES

BACKGROUND OF THE INVENTION

1. Field of the Invention

The present invention relates to a method and semiconductor device for monitoring battery voltages.

2. Description of the Related Art

Semiconductor devices for monitoring a plurality of unit batteries or battery cells connected in series are already available. Well known examples include battery monitoring integrated circuits (ICs) for vehicles. For example, in Japanese Patent Application Publication No. 2003-070179, Miyazaki et al. disclose an electrical storage device including a plurality of high-energy cells connected in series in a hybrid electric vehicle, and a method of controlling the electrical storage device. The disclosed method employs a battery monitoring IC with the configuration shown in simplified form in FIG. 1.

Figure 1:
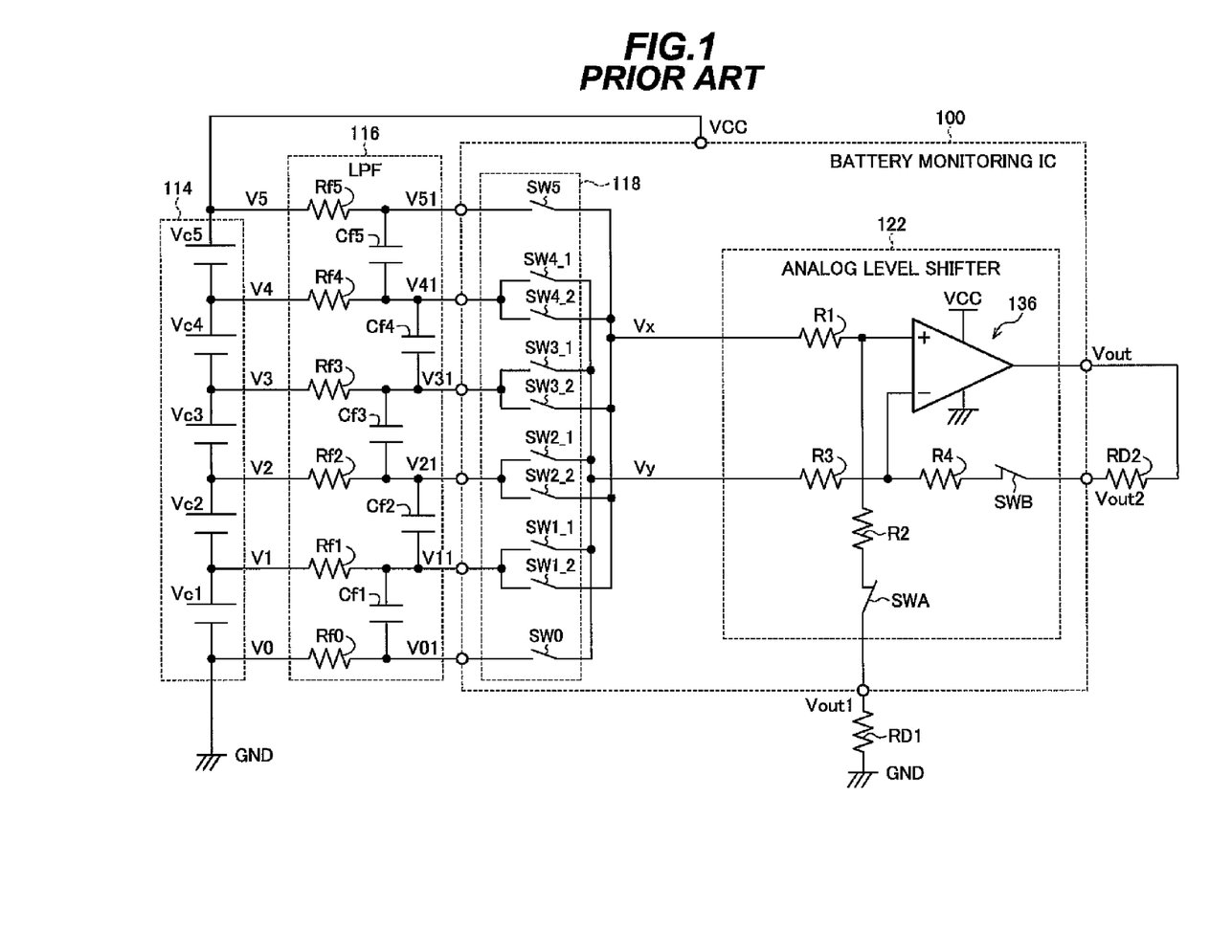
FIG. 1 is a circuit diagram showing an exemplary schematic structure of a conventional semiconductor device.

The battery monitoring IC 100 in FIG. 1 is connected through a low-pass filter circuit (LPF) 116 to a battery 114 including five battery cells Vc5 to Vc1 coupled in series. The positive terminal of battery cell Vc5 is connected to the VCC power supply terminal of the battery monitoring IC 100. The negative terminal of battery cell Vc1 is connected to ground (GND). The two terminals of each of the battery cells Vc5 to Vc1 in the battery 114 are connected through the low-pass filter circuit 116 to corresponding inputs of a cell selector switch 118 in the battery monitoring IC 100. The low-pass filter circuit 116 includes resistors Rf5 to Rf0 and capacitors Cf5 to Cf1. The cell selector switch 118 includes switching elements SW5, SW4_1, SW4_2, ..., SW1_1, SW1_2, SW0, which receive voltages V05, V04, ..., V02, V01. The outputs Vx, Vy of the cell selector switch 118 are connected to an analog level shifter 122 that includes current sensing resistors R4 to R1, an amplifier 136, and dummy switches SWA and SWB. The dummy switches SWA and SWB are similar to the switching elements in the cell selector switch 118 except that they are permanently switched on. External resistors RD2 and RD1, having the same resistance value as resistors Rf5 to Rf0 in the low-pass filter circuit 116, are connected to the analog level shifter 122 at terminals Vout2 and Vout1 to provide symmetrical paths from the input terminals of the amplifier 136 to the battery 114, the output terminal of the amplifier 136, and ground.

To measure the voltage of battery cell Vc5, for example, switching elements SW5 and SW4_1 are turned on and the other switching elements in the cell selector switch 118 are turned off. Since the voltage-sensing resistors R1-R4 have mutual identical resistance values and switching elements SW5, SW4_1, SWA, and SWB have mutual identical on-resistance values, the voltage (V5–V4) across battery cell Vc5 is converted by the analog level shifter 122 to an equal output voltage Vout with respect to ground (Vout=V5–V4).

The voltages across battery cells Vc4 to Vc1 are measured similarly, with switching elements SW4_2 and SW3_1, SW3_2 and SW2_1, SW2_2 and SW2_1, and SW1_2 and SW0 turned on, respectively.

Figure 2:
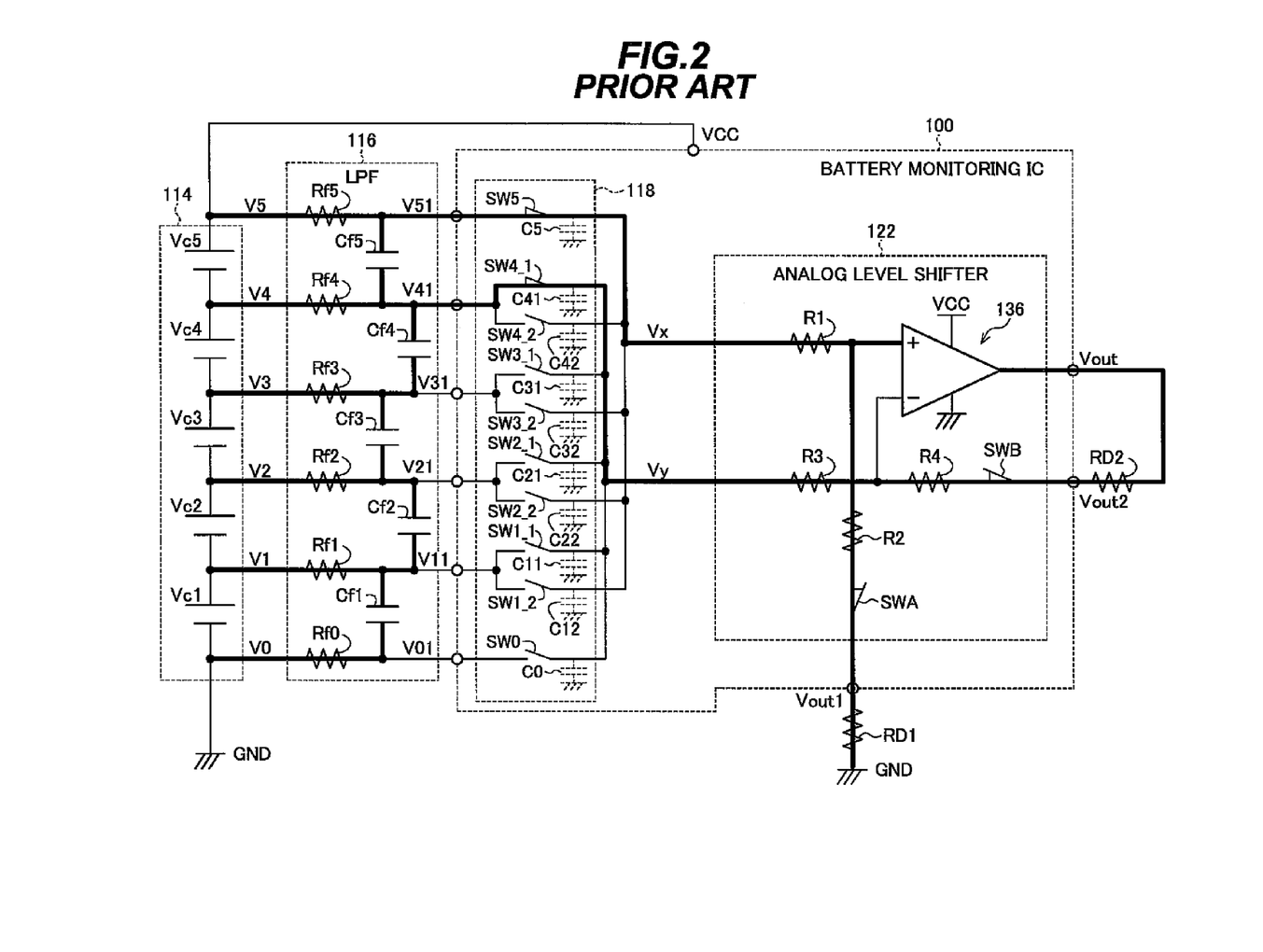
FIG. 2 indicates current paths when the voltage of battery cell Vc5 is measured by the conventional semiconductor device.

Referring to FIG. 2, the switching elements in the cell selector switch 118 are metal-oxide-semiconductor (MOS) transistors having respective parasitic capacitances C5, C41, C42, ..., C11, C12, C0 with respect to ground. The dummy switching elements SWA, SWB and the wiring connecting them to the cell selector switch 118, amplifier 136, and ground also have parasitic capacitances. When the switching elements in the cell selector switch are all turned off, these parasitic capacitances discharge to ground level.

When switching elements SW5 and SW4_1 are switched on to measure the voltage across battery cell Vc5, for example, there is sudden transfer of charge on the paths indicated by the thick black lines in FIG. 2. The voltage V51 received by switching element SW5 plunges as charge moves from capacitor Cf5 in the low-pass filter circuit 116 toward ground through terminal Vout1, and into the parasitic capacitances en route. This plunge is followed by a gradual recovery as capacitor Cf5 is recharged from the positive terminal of battery cell Vc5.

In addition, when switching element SW5 is switched on, the voltage at the non-inverting input terminal of amplifier 136 rises. The output voltage Vout rises abruptly in response and is fed back through terminal Vout2, pulling up the voltage V41 input to switching element SW4_1. Due to the reduced difference between voltages V51 and V41, however, the initial abrupt rise in the output voltage Vout is followed by a droop that persists for some time until the correct output value (V5–V4) is attained. These changes in V51, V41, and Vout are illustrated schematically in FIG. 3.

Figure 3:
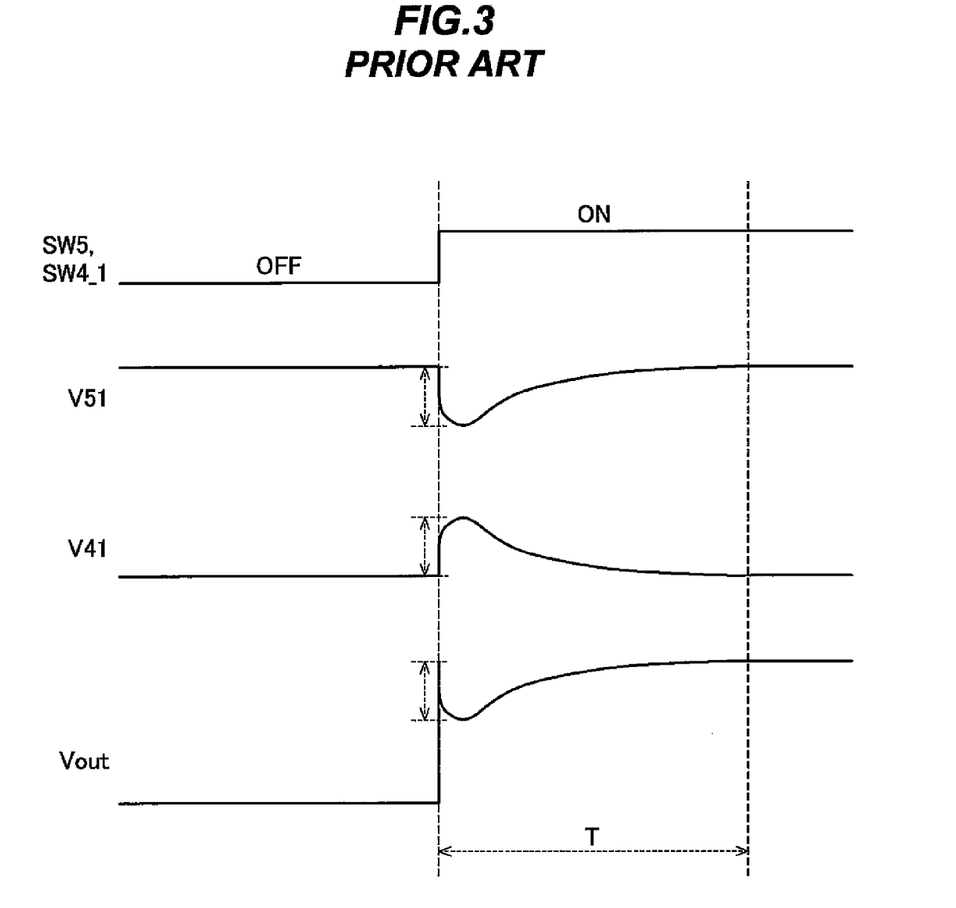
FIG. 3 is a waveform diagram showing exemplary waveforms pertaining to the voltage measurement in FIG. 2.

The time T taken to recover from the output voltage droop depends on the time constant of the low-pass filter circuit 116, which increases with the resistance values of resistors Rf5 to Rf0 and the capacitance values of capacitors Cf5 to Cf1. If the time constant is large enough to provide the filtering effect needed for accurate measurement, the recovery period T can be fairly long.

During the recovery period T and until the measurement ends, there is a continuing flow of current from the battery 114 to ground and to the output terminal of the amplifier 136 on the paths indicated in FIG. 2. For accurate measurement, the transistors in the cell selector switch 118 must be large enough to carry these currents. With the conventional battery monitoring IC 100, accordingly, it can take significant time for the output of the analog level shifter 122 to stabilize and the correct measurement to be obtained, and large switching elements are necessary.

SUMMARY OF THE INVENTION

An object of the present invention is to shorten battery voltage measurement time.

The invention provides a semiconductor device for monitoring a plurality of unit batteries connected in series. The semiconductor device includes a selector switch that selects one of the unit batteries and outputs a first voltage obtained from the positive terminal of the selected unit battery and a second voltage obtained from the negative terminal of the selected unit battery.

A first buffer amplifier receives the first voltage from the selector switch and outputs a corresponding voltage. A second buffer amplifier receives the second voltage from the selector switch and outputs a corresponding voltage. The first and second buffer amplifiers have high-impedance input terminals that block current flow from the selector switch.

A level shifter receives the voltage outputs of the first and second buffer amplifiers and produces a shifted voltage corresponding to the difference between the first voltage and the second voltage as the output of the semiconductor device.

Since the buffer amplifiers block input current flow, even if the semiconductor device is connected to the unit batteries through a low-pass filter circuit with a comparatively large time constant, output voltage droop is reduced to a small amount and the recovery time is shortened accordingly.

DETAILED DESCRIPTION OF THE INVENTION

Embodiments of the invention will now be described with reference to the attached drawings, in which like elements are indicated by like reference characters. The unit batteries will be referred to as battery cells.

First Embodiment

Figure 4:
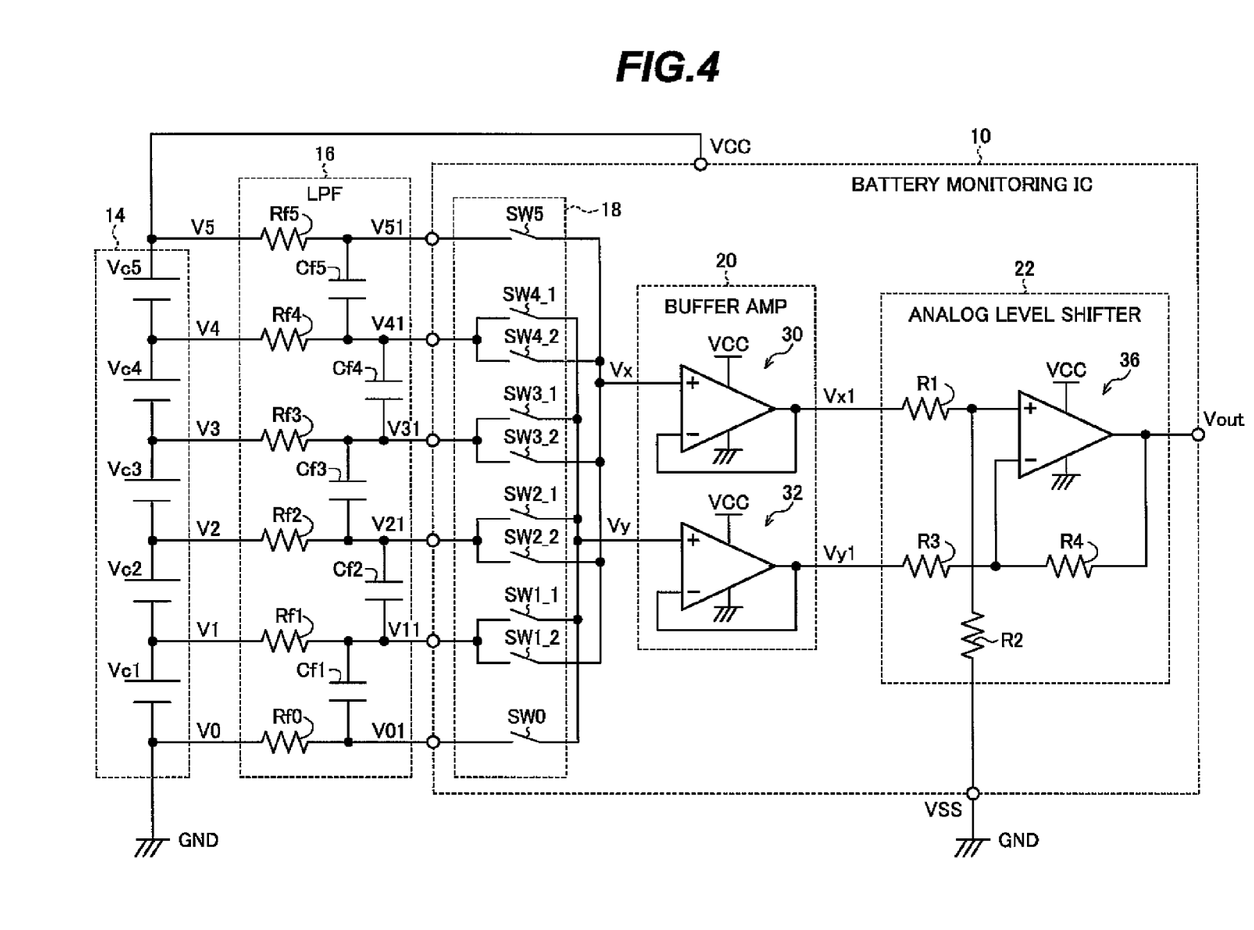
FIG. 4 is a circuit diagram showing an exemplary schematic structure of a semiconductor device according to a first embodiment of the invention.

Referring to FIG. 4, the battery monitoring IC 10 in the first embodiment measures the voltage of a battery 14 to which the battery monitoring IC 10 is connected through a low-pass filter circuit (LPF) 16. The battery monitoring IC 10 includes a cell selector switch 18, a buffer amplifier (amp) circuit 20, and an analog level shifter 22. The buffer amplifier circuit 20 includes a pair of buffer amplifiers 30, 32. The analog level shifter 22 includes voltage-sensing resistors R4 to R1 and an amplifier 36.

The battery 14 includes, for example, five battery cells Vc5 to Vc1 connected in series. The positive terminal of battery cell Vc5 is connected to the VCC power supply terminal of the battery monitoring IC 10. The negative terminal of battery cell Vc1 is connected to ground. The voltages V5 to V0 at the terminals of the battery cells Vc5 to Vc1 are supplied to the cell selector switch 18 through the low-pass filter circuit 16, which includes resistors Rf5 to RF0 and capacitors Cf5 to Cf1.

The cell selector switch 18 in this embodiment includes high-voltage MOS transistors connected to operate as mutually identical switching elements SW5, SW4_1, SW4_2, ..., SW1_1, SW1_2, SW0. Each of these switching elements has, for example, the configuration shown in FIG. 5, including an n-channel metal-oxide-semiconductor (NMOS) transistor 70, a p-channel metal-oxide-semiconductor (PMOS) transistor 72, and an inverter 74. When the control signal input to the inverter 74 is at the high logic level, the NMOS transistor 70 and PMOS transistor 72 are switched on and pass a voltage from the low-pass filter circuit 16 to the buffer amplifier circuit 20. When the control signal input to the inverter 74 is at the low logic level, the NMOS transistor 70 and PMOS transistor 72 are switched off and the switching element is in the high-impedance state.

Figure 5:
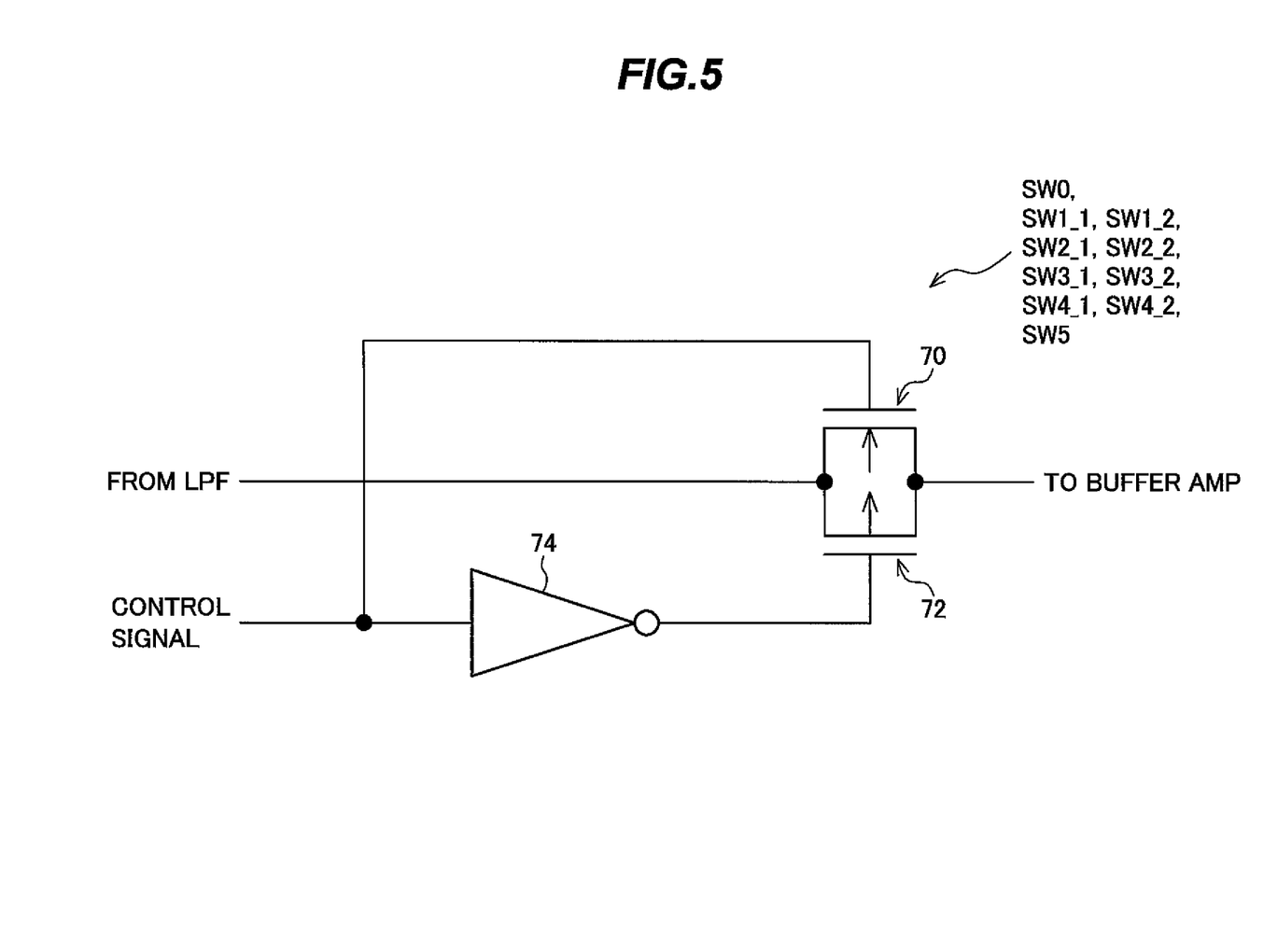
FIG. 5 is a circuit diagram showing an exemplary schematic structure of the switching elements in FIG. 4.

Other configurations for the switching elements in the cell selector switch 18 are also possible, provided high-voltage transistors are used.

The outputs of the cell selector switch 18 are connected to the non-inverting terminals of the buffer amplifiers in the buffer amplifier circuit 20. Specifically, switching elements SW5, SW4_2, SW3_2, SW2_2, and SW1_2 are connected to the non-inverting terminal of buffer amplifier 30, while switching elements SW4_1, SW3_1, SW2_1, SW1_1, and SW0 are connected to the non-inverting terminal of buffer amplifier 32. The output of each buffer amplifier is connected as negative feedback to the inverting terminal of the same buffer amplifier, so that the buffer amplifiers 30, 32 operate as voltage followers.

Figure 6:
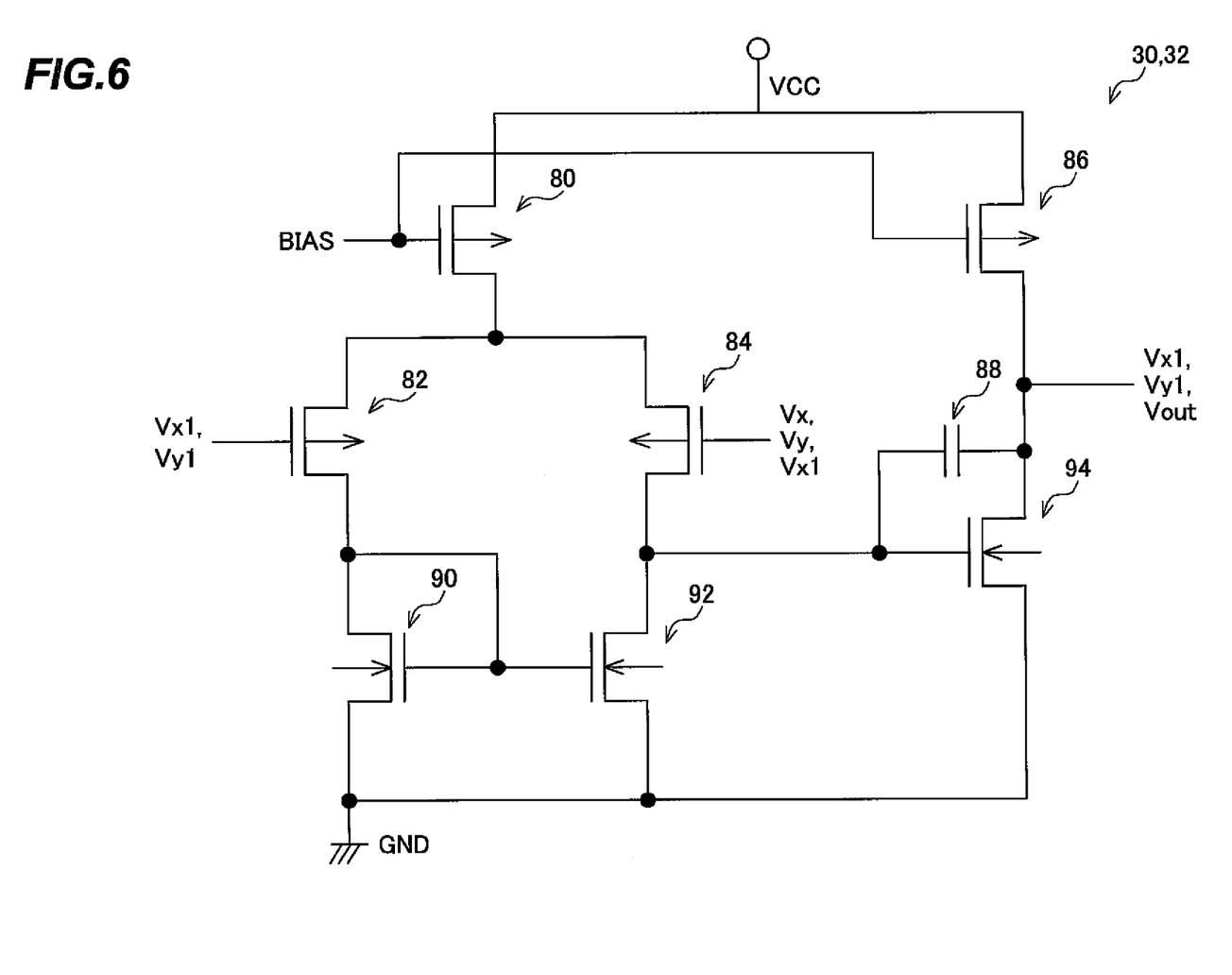
FIG. 6 is a circuit diagram showing an exemplary schematic structure of the buffer amplifiers in FIG. 4.

Both buffer amplifiers 30, 32 are identically configured. Referring to FIG. 6, each of the buffer amplifiers 30, 32 includes high-voltage PMOS transistors 80, 82, 84, 86, a capacitor 88, and high-voltage NMOS transistors 90, 92, 94. PMOS transistor 80 is biased at a voltage that permits saturation operation. The input impedance of the buffer amplifiers 30, 32 is low because the only input current flow is a small transient flow into or out of the gate capacitances of transistors 82 and 84 when the input voltages change. The buffer amplifiers 30, 32 output respective voltages Vx1 and Vy1 equal to the voltages Vx and Vy input at their non-inverting terminals.

Other configurations of the buffer amplifiers 30, 32 are also possible provided high-voltage transistors are used.

The outputs of the buffer amplifier circuit 20 are connected to the analog level shifter 22. The output Vx1 of buffer amplifier 30 is connected through voltage-sensing resistor R1 to the non-inverting terminal of the amplifier 36; the output Vy1 of buffer amplifier 32 is connected through voltage-sensing resistor R3 to the inverting terminal of the amplifier 36.

The analog level shifter 22 outputs the difference Vout between the voltages at the two terminals of the battery cell selected by the cell selector switch 18 as the output of the battery monitoring IC 10. An exemplary configuration of the analog level shifter 22 in this embodiment includes a amplifier 36 having the same configuration as the buffer amplifiers 30, 32 shown in FIG. 6 and voltage-sensing resistors R4 to R1 having mutually identical resistance values (R4=R3=R2=R1). Resistor R2 is coupled to ground at an external terminal VSS.

How the battery voltages of the battery cells Vc5 to Vc1 are measured by the battery monitoring IC 10 in this embodiment will be described with reference to FIGS. 7 and 8. When the voltage (V5–V4) of battery cell Vc5 is measured, switching elements SW5 and SW4_1 in the cell selector switch 18 are switched on and the other switching elements are switched off. Because of the high input impedance of the buffer amplifiers 30, 32, there is no current flow through resistors Rf5 and Rf4 and no corresponding voltage drop (V51=V5, V41=V4). The outputs Vx, Vy of the cell selector switch 18 (via switching elements SW5 and SW4_1) and the outputs of the buffer amplifiers 30, 32 are therefore equal to the voltages at the terminals of battery cell Vc5 (Vx1=Vx=V5, Vy1=Vy=V4). Accordingly, a voltage equal to the voltage across battery cell Vc5 (V5–V4) but referenced to ground is output from the analog level shifter 22 as the external output Vout.

Similarly, to measure the voltage of battery cell Vc4, switching elements SW4_2 and SW3_1 are switched on, the other switching elements in the cell selector switch 18 are switched off, and the analog level shifter 22 outputs a voltage Vout equal to V4−V3. To measure the voltage of battery cell Vc3, switching elements SW3_2 and SW2_1 are switched on, the other switching elements are switched off, and the analog level shifter 22 outputs a voltage Vout equal to V3−V2. To measure the voltage of battery cell Vc2, switching elements SW2_2 and SW1_1 are switched on, the other switching elements are switched off, and the analog level shifter 22 outputs a voltage Vout equal to V2−V1. To measure the voltage of battery cell Vc1, switching elements SW1_2 and SW0 are switched on, the other switching elements are switched off, and the analog level shifter 22 outputs a voltage Vout equal to V1−V0.

The voltages of the constituent cells Vc5 to Vc1 of the battery 14 can therefore be read from the output Vout of the battery monitoring IC 10. The battery monitoring IC 10 can be used to measure the voltages of the batteries in electric vehicles, hybrid vehicles, and other types of vehicles.

Figure 7:
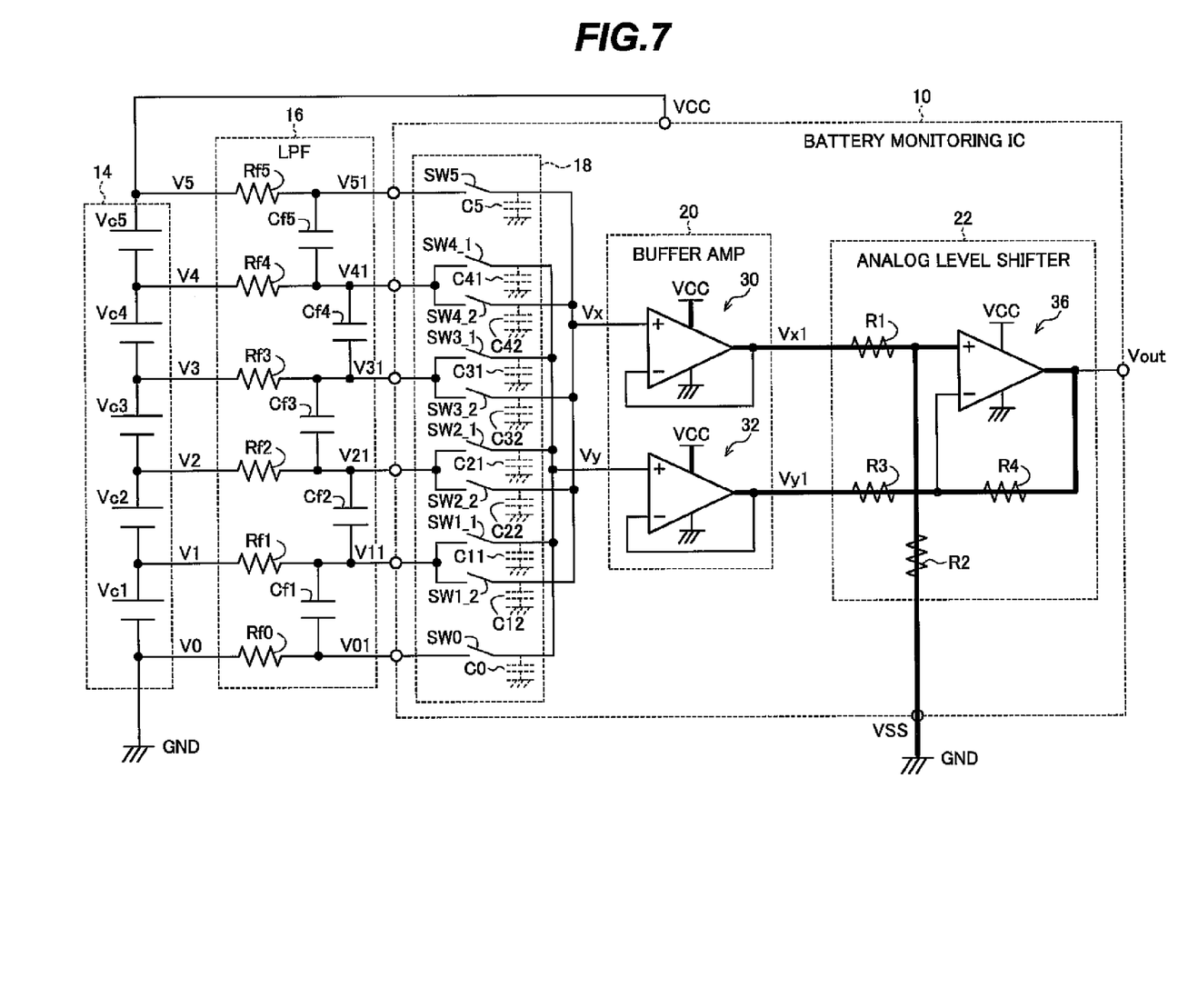
FIG. 7 indicates current paths when the voltage of battery cell Vc5 is measured by the semiconductor device in FIG. 4.
Figure 8:
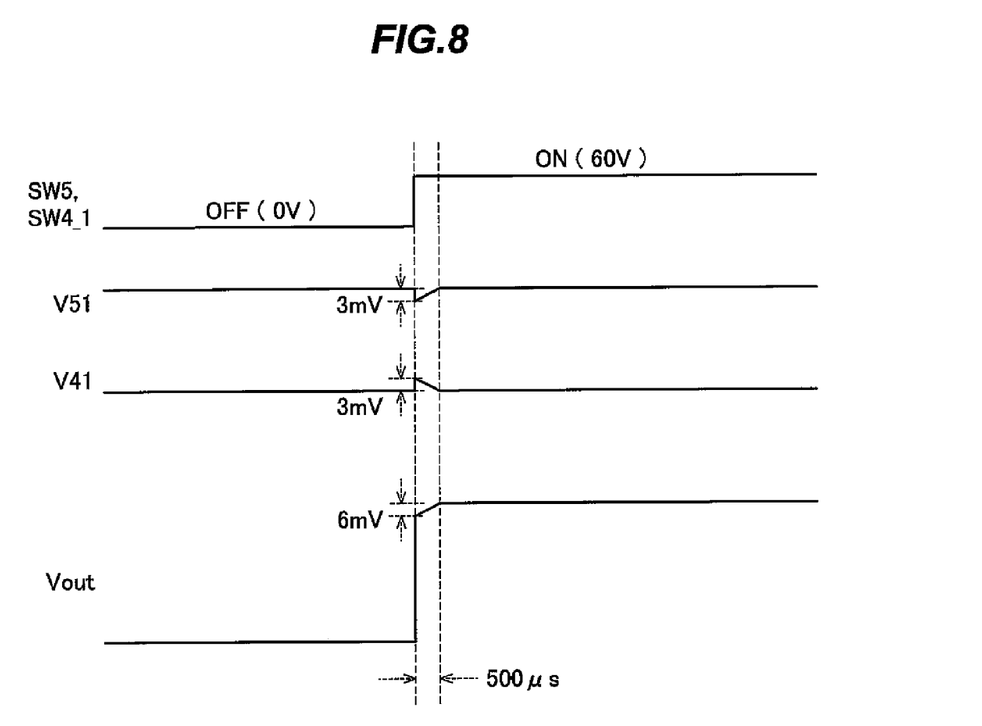
FIG. 8 is a waveform diagram showing exemplary waveforms pertaining to the voltage measurement in FIG. 7.

Because of the high input impedance of the buffer amplifiers 30, 32, during these voltage measurements, although current flows on the paths indicated by the thick black lines in FIG. 7, there is substantially no current flow through the low-pass filter circuit 16 and cell selector switch 18. Since the switching elements in the cell selector switch 18 have very little current to switch, they can be small in size. Specifically, the gate lengths and especially the gate widths of the switching elements in the cell selector switch 18 can be small, which reduces their parasitic capacitances C5, C41, C42, ..., C11, C12, C0.

Due to the very high input impedance of the buffer amplifiers 30, 32 and the small parasitic capacitances in the cell selector switch 18, when a pair of switching elements in the cell selector switch 18 is switched on, there is only a small transfer of charge between the low-pass filter circuit 16 and the battery monitoring IC 10. For example, when switching elements SW5 and SW4_1 are switched on, there is only a slight flow of charge among capacitor Cf5 in the low-pass filter circuit 16, parasitic capacitances C5 and C4_1 in the cell selector switch 18, and the gate capacitances of the input transistors in the buffer amplifiers 30, 32. Consequently, a small and brief flow of current through resistors Rf5 and Rf4 suffices to recharge capacitor Cf5, and in contrast to the conventional battery monitoring IC 100 in FIG. 2, there is no flow of current through resistors Rf5 and Rf4 to ground, or to the amplifier 36 in the analog level shifter 22.

When switching elements SW5 and SW4_1 are switched on, therefore, there is only a brief and slight change in the voltages V51 and V41 at the corresponding input terminals of the battery monitoring IC 10, and the output voltage Vout stabilizes quickly. Referring to FIG. 8, if the on and off voltage levels of switching elements SW5 and SW4_1 are, for example, 60 V and 0 V, respectively, then given typical resistance and capacitance values, the shift of charge between the low-pass filter 16 and the battery monitoring IC 10 produces only a 3-mV drop in voltage V51 and a 3-mV rise in voltage V41, and both voltages recover their normal levels within 500 μs. As a result, there is an initial droop of only 6 mV in the output voltage Vout, and the battery cell voltage can be measured accurately in 500 μs.

Similar effects of reduced output droop and shortened measurement time are obtained when the voltages of the other battery cells Vc4 to Vc0 are measured.

The buffer amplifiers 30, 32 replace the dummy switches SWA, SWB and dummy resistors RD1, RD2 in the conventional battery monitoring IC 100 in FIG. 1, which are not needed because there is essentially no current flow between the low-pass filter circuit 16 and the battery monitoring IC 10. The absence of these dummy switches and dummy resistors and the reduced size of the switching elements in the cell selector switch 18 compensate for the additional presence of the buffer amplifier circuit 20, so that adding the buffer amplifier circuit 20 does not greatly increase the size and cost of the battery monitoring IC 10. Another factor is that the buffer amplifier circuit 20 receives its power supply VCC from the positive terminal of battery cell Vc5 in the battery 14, so that no additional power source is required.

Second Embodiment

Figure 9:
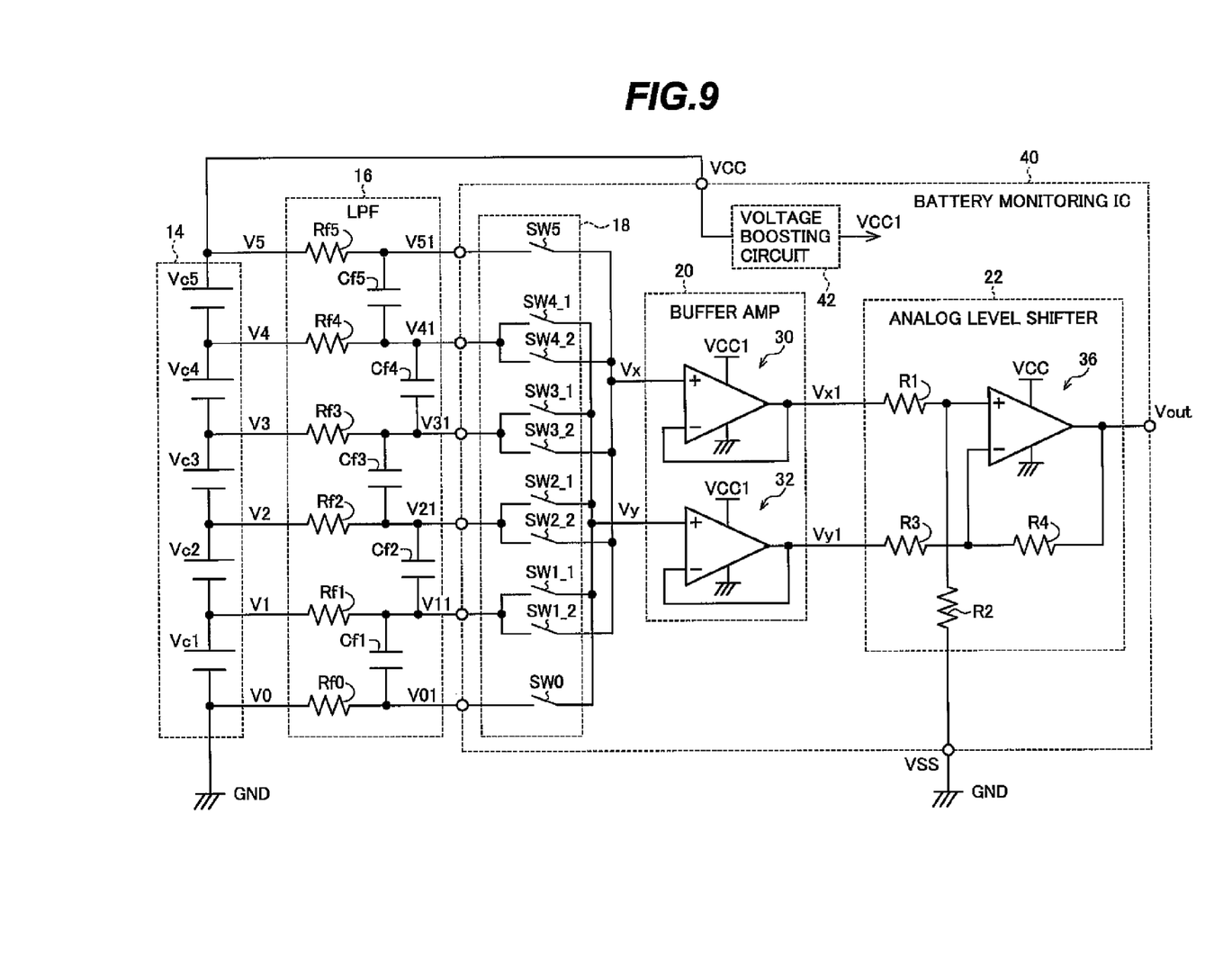
FIG. 9 is a circuit diagram showing an exemplary schematic structure of a semiconductor device according to a second embodiment of the invention.

Referring to FIG. 9, the second embodiment is identical to the first embodiment except that the battery monitoring IC 40 in the second embodiment has an additional voltage boosting circuit 42, which supplies power to the buffer amplifier circuit 20 at a voltage VCC1 higher than the power supply voltage VCC the battery monitoring IC 40 receives from the battery 14. The amplifier 36 in the analog level shifter 22 operates on VCC as in the first embodiment.

In the first embodiment, since the buffer amplifiers 30, 32 receive the voltage at the positive terminal of battery cell Vc5 as their power supply voltage, when the voltage of battery cell Vc5 is measured, the input voltage Vx of buffer amplifier 30 is the same as its power supply voltage VCC. This leads to a high-end offset in the output voltage Vx1 of buffer amplifier 30, and affects the accuracy of the output voltage Vout. The offset continues until Vx becomes low enough for the transistors in buffer amplifier 30 to conduct saturation current.

In the second embodiment, the voltage boosting circuit 42 boosts the power supply voltage of the buffer amplifiers 30, 32 to a level such that their constituent transistors can conduct saturation current over the full range of possible input voltages Vx and Vy. The outputs Vx1 and Vy1 of buffer amplifiers 30 and 31 are accordingly free of high-end offset, and the accuracy of the measurement of the battery cell voltages by the output voltage Vout is improved.

The level to which the voltage boosting circuit 42 boosts the power supply voltage is a design choice that depends on the characteristics of the MOS transistors in the buffer amplifiers 30, 32. As one example, if VCC is 60 V, a voltage VCC1 of 65 V may be adequate to permit the MOS transistors operate in their saturation region.

In a variation of the second embodiment, the boosted supply voltage VC1 is supplied from an external source, instead from a voltage boosting circuit in the battery monitoring IC 40.

In another variation of the second embodiment, the battery voltage VCC and the boosted voltage VCC1 are supplied selectively to the buffer amplifiers 30, 32, depending on the VCC level and the state of the cell selector switch 18, for example.

Third Embodiment

Figure 10:
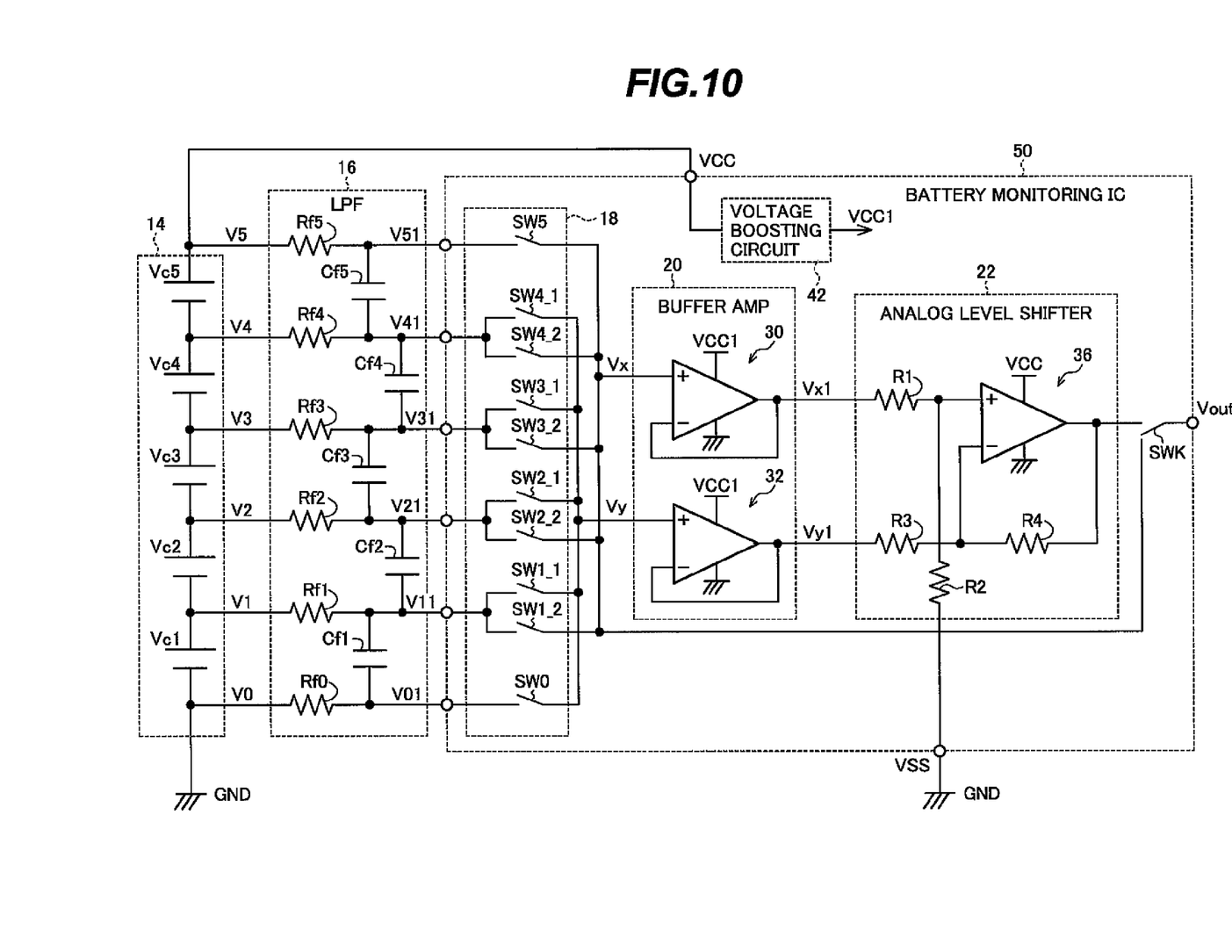
FIG. 10 is a circuit diagram showing an exemplary schematic structure of a semiconductor device according to a third embodiment.

Referring to FIG. 10, the third embodiment is identical to the second embodiment except that the battery monitoring IC 50 has an additional bypass switching element SWK that can bypass the buffer amplifier circuit 20 and analog level shifter 22. Switching element SWK selects either the Vx output of the cell selector switch 18 or the output of the analog level shifter 22 as the output voltage Vout of the battery monitoring IC 50.

In the first and second embodiments, when the voltage of battery cell Vc1 is measured, buffer amplifier 32 receives the ground voltage at the negative terminal of battery cell Vc1 as its input voltage Vy. Since this voltage is identical to the ground voltage of buffer amplifier 32 itself, MOS transistors in buffer amplifier 32 fail to conduct saturation current, producing a low-end offset in the output voltage Vy1 of buffer amplifier 32. This offset also affects the accuracy of the output voltage Vout.

In the third embodiment, when the voltage of battery cell Vc1 is measured, switching elements SW0 and SW1_2 in the cell selector switch 18 are switched on, and switching element SWK is set to select voltage Vx as the output Vout of the battery monitoring IC 50, bypassing the buffer amplifier circuit 20 and analog level shifter 22. The problem of non-saturated operation of buffer amplifier 32 is therefore also bypassed, improving the accuracy of the measurement of the voltage of battery cell Vc1. The analog level shifter 22 is unnecessary for this measurement because with switching elements SW0 and SW1_2 in the cell selector switch 18 switched on, Vx itself is the voltage across battery cell Vc1 with respect to ground.

Although the positive terminal of battery cell Vc1 is now connected directly to the output terminal of the battery monitoring IC 50, this output terminal is normally connected to a next-stage circuit (not shown) with high input impedance. Accordingly, there is still no significant flow of current on this current path and no significant voltage drop in resistor Rf1 in the low-pass filter circuit 16.

When the voltages of the other battery voltage cells Vc2 to Vc5 are measured, switching element SWK is set to select the output voltage of the analog level shifter 22 as the output voltage Vout of the battery monitoring IC 50.

Fourth Embodiment

Figure 11:
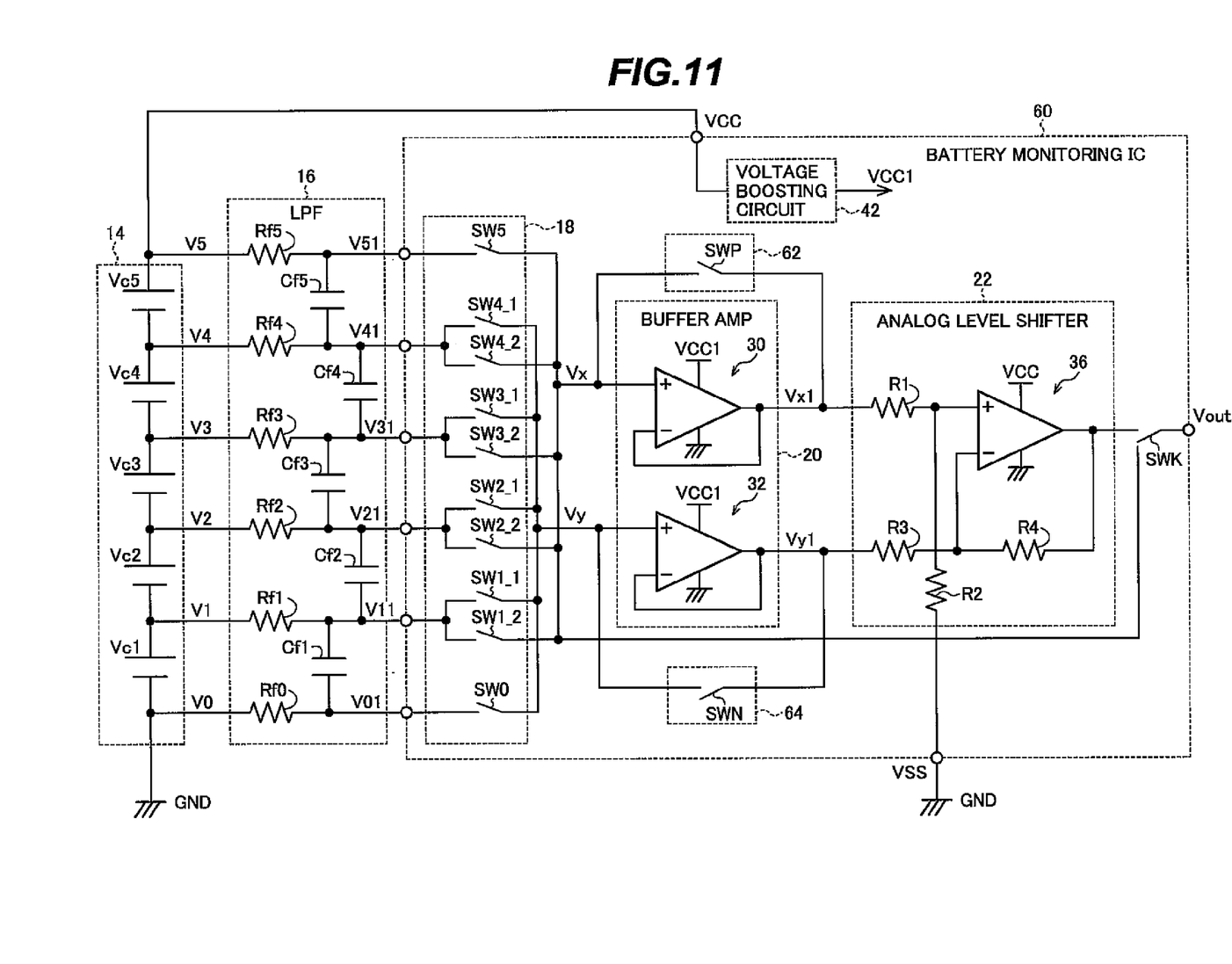
FIG. 11 is a circuit diagram showing an exemplary schematic structure of a semiconductor device according to a fourth embodiment.

Referring to FIG. 11, the fourth embodiment adds a pair of test switching elements SWP and SWN to the configuration shown in the third embodiment. When switched on, switching element SWP bypasses buffer amplifier 30 by connecting its non-inverting input terminal directly to its output terminal, and switching element SWN bypasses buffer amplifier 32 in a similar fashion. When switching elements SWP and SWN are switched off, the battery monitoring IC 60 in the fourth embodiment operates in the same way as the battery monitoring IC 50 in the third embodiment.

Switching elements SWP and SWN are used to test the buffer amplifiers 30, 32. The voltages of battery cells Vc5 to Vc1 are measured first with switching elements SWP and SWN switched off and then with switching elements SWP and SWN switched on, and the two sets of measurement results are compared. If both results agree to within a predetermined tolerance, the test passes and the buffer amplifiers 30, 32 are regarded as operating normally. If the results disagree, the test fails, indicating that one or both of the buffer amplifiers 30, 32 is defective.

In the fourth embodiment, the battery monitoring IC 60 accordingly has a self-test capability that can be used to detect voltage measurement accuracy problems caused by malfunctions of the buffer amplifiers 30, 32 and take corrective action.

The five-cell battery 14 shown in the drawings is purely exemplary. The invention may be used to monitor the voltages of a battery consisting of any number of cells connected in series, or the voltages of multiple batteries connected in series. In the latter case each battery unit may be a battery including multiple cells.

The capacitors Cf5 to Cf1 in the low-pass filter circuit 16 may be connected between the positive terminals of the battery cells Vc5 to Vc1 and ground, for example, instead of being connected between the positive and negative terminals of these battery cells as shown in the drawings.

Those skilled in the art will recognize that further variations are possible within the scope of the invention, which is defined in the appended claims.

What is claimed is:

1. A semiconductor device for monitoring a plurality of unit batteries having respective positive and negative terminals, the unit batteries being connected in series, the semiconductor device comprising:
   a selector switch including a plurality of switching elements for selecting one of the unit batteries and outputting a first voltage obtained from the positive terminal of the selected unit battery and a second voltage obtained from the negative terminal of the selected unit battery;
   a first buffer amplifier having a first high-impedance input terminal for receiving the first voltage from the selector switch and blocking flow of current from the selector switch, and a first output terminal for output of a voltage corresponding to the first voltage;
   a second buffer amplifier having a second high-impedance input terminal for receiving the second voltage from the selector switch and blocking flow of current from the selector switch, and a second output terminal for output of a voltage corresponding to the second voltage; and
   a level shifter connected to the first output terminal of the first buffer amplifier and the second output terminal of the second buffer amplifier, for outputting a shifted voltage corresponding to a difference between the first voltage and the second voltage.

2. The semiconductor device of claim 1, wherein the semiconductor device is connected to the unit batteries through a low-pass filter circuit.

3. The semiconductor device of claim 1, wherein the first and second buffer amplifiers are voltage follower amplifiers.

4. The semiconductor device of claim 1, wherein the first and second buffer amplifiers and the level shifter are powered by the plurality of unit batteries.

5. The semiconductor device of claim 4, further comprising a voltage boosting circuit for boosting a power supply voltage obtained from the plurality of unit batteries to a boosted voltage, and supplying the boosted voltage to the first and second buffer amplifiers.

6. The semiconductor device of claim 1, further comprising a bypass switch for selecting, for output from the semiconductor device, one of the first voltage output from the selector switch and the shifted voltage output from the level shifter.

7. The semiconductor device of claim 1, further comprising:
   a first test switch, for selectively interconnecting the first high-impedance input terminal and the first output terminal of the first buffer amplifier; and
   a second test switch, for selectively interconnecting the second high-impedance input terminal and the second output terminal of the second buffer amplifier.

8. A method of monitoring voltages of a plurality of unit batteries having respective positive and negative terminals, the unit batteries being connected in series, the method comprising:
   using a plurality of switching elements to select one of the unit batteries and output a first voltage obtained from the positive terminal of the selected unit battery and a second voltage obtained from the negative terminal of the selected unit battery;
   using a first buffer amplifier having a first high-impedance input terminal for receiving the first voltage from the selector switch and blocking flow of current from the selector switch to output a voltage corresponding to the first voltage from a first output terminal;

using a second buffer amplifier having a second high-impedance input terminal for receiving the second voltage from the selector switch and blocking flow of current from the selector switch to output a voltage corresponding to the second voltage from a second output terminal; and using a level shifter connected to the first output terminal of the first buffer amplifier and the second output terminal of the second buffer amplifier to output a shifted voltage corresponding to a difference between the first voltage and the second voltage.

9. The method of claim 8, further comprising receiving the first voltage and the second voltage from the unit batteries through a low-pass filter circuit.

10. The method of claim 8, wherein the first and second buffer amplifiers are voltage follower amplifiers.

11. The method of claim 8, further comprising supplying power from the plurality of unit batteries to the first and second buffer amplifiers and the level shifter.

12. The method of claim 11, further comprising boosting a power supply voltage obtained from the plurality of unit batteries to a boosted voltage, and supplying the boosted voltage to the first and second buffer amplifiers.

13. The method of claim 8, further comprising selecting one of the first voltage and the shifted voltage for final output.

14. The method of claim 13, wherein said selecting one of the first voltage and the shifted voltage includes selecting the first voltage when the selected unit battery has the negative terminal connected to ground.

15. The method of claim 8, further comprising testing the first buffer amplifier and the second buffer amplifier by:
   measuring a voltage of the selected unit battery by measuring the shifted voltage a first time;
   bypassing the first buffer amplifier by interconnecting the first high-impedance input terminal and the first output terminal;
   bypassing the second buffer amplifier by interconnecting the second high-impedance input terminal and the second output terminal;
   measuring the voltage of the selected unit battery by measuring the shifted voltage a second time while the first and second buffer amplifiers are bypassed; and
   comparing the voltages measured the first time and the second time.

16. A semiconductor device for receiving a first potential of first terminals of a plurality of battery cells being connected in series and a second potential of second terminals of a plurality of the battery cells through a filter having capacitor means, the semiconductor device detecting a voltage of a selected battery cell that is selected from a plurality of the battery cells on basis of a difference of the first potential of the first terminal and the second potential of the second terminal of the selected battery cell, comprising:
   a first cell selection switch connected to the first terminal of each of a plurality of the battery cells through the filter, for outputting the first potential of the first terminal of the selected battery cell;
   a second cell selection switch connected to the second terminal of each of a plurality of the battery cells through the filter, for outputting the second potential of the second terminal of the selected battery cell;
   a first buffer amplifier including a first transistor, wherein the first potential of the first terminal of the selected battery cell is input from the first cell selection switch to a gate of the first transistor and a first voltage based on the first potential of the first terminal is output from the first buffer amplifier;
   a second buffer amplifier including a second transistor, wherein the second potential of the second terminal of the selected battery cell is input from the second cell selection switch to a gate of the second transistor and a second voltage based on the second potential of the second terminal is output from the second buffer amplifier; and
   a difference output means for outputting a first differential potential that is a difference between the first voltage and the second voltage.

17. The semiconductor device according to claim 16, wherein
   the first potential of the first terminal is a positive potential of each of the battery cells, the second potential of the second terminal is a negative potential of each of the battery cells; and
   the first voltage is input to a non-inverting terminal of the difference output means, the second voltage is input to an inverting terminal of the difference output means.

18. The semiconductor device according to claim 16,
   wherein a power supply voltage for powering the first buffer amplifier and the second buffer amplifier is supplied from a plurality of the battery cells being connected in series;
   the semiconductor device further comprising a voltage boosting circuit for boosting the power supply voltage supplied from a plurality of the battery cells being connected in series to a first voltage value so that the first transistor operates in a first saturation region of the first transistor, if the power supply voltage is lower than the first voltage value, and for boosting the power supply voltage supplied from a plurality of the battery cells being connected in series to a second voltage value so that the second transistor operates in a second saturation region of the second transistor, if the power supply voltage is lower than the second voltage value; and
   wherein the power supply voltage boosted by the voltage boosting circuit is supplied to the first buffer amplifier and the second buffer amplifier.

19. The semiconductor device according to claim 16, further comprising:
   a first switching element for controlling connection between an input terminal and an output terminal of the first buffer amplifier; and
   a second switching element for controlling connection between an input terminal and an output terminal of the second buffer amplifier,
   wherein
   the semiconductor device
   compares the first differential voltage and a second differential voltage, the first differential voltage being a difference between the first voltage and the second voltage obtained by the difference output means in a state that the input terminal and the output terminal of the first buffer amplifier are not connected by the first switching element and the input terminal and the output terminal of the second buffer amplifier are not connected by the second switching element, the second differential voltage being a difference between the first potential of the first terminal of the selected battery cell and the second potential of the second terminal of the selected battery cell in another state that the input terminal and the output terminal of the first switching element are connected by the first switching element and the input terminal and the output terminal of the second switching element are connected by the second switching element;

judges that the first buffer amplifier and the second buffer amplifier operate normally, if the first differential voltage and the second differential voltage are agreed to each other; and judges that the first buffer amplifier and the second buffer amplifier are defective, if the first differential voltage and the second differential voltage are not agreed to each other.

20. The semiconductor device according to claim 16, further comprising:

a selector element for changing a voltage to be detected as that of the selected battery cell from the first differential voltage to the second potential of the second terminal of the selected battery cell, if the battery cell whose the second potential of the second terminal is connected to ground is selected among a plurality of the battery cells being connected in series.

* * * * *